United States Patent [19]
Hatsukano et al.

[11] 3,969,717
[45] July 13, 1976

[54] DIGITAL CIRCUIT TO ELIMINATE DISPLAY FLICKER

[75] Inventors: Yoshikazu Hatsukano, Kodaira; Kosei Nomiya, Tokyo; Hiroto Kawagoe, Kodaira, all of Japan

[73] Assignee: Hitachi, Ltd., Japan

[22] Filed: Nov. 20, 1974

[21] Appl. No.: 525,674

Related U.S. Application Data

[62] Division of Ser. No. 332,522, Feb. 14, 1973, Pat. No. 3,870,897.

[30] Foreign Application Priority Data

Feb. 14, 1972 Japan............................... 47-14805

[52] U.S. Cl.......................... 340/324 M; 340/168 S; 340/336
[51] Int. Cl.²............................................. G06F 3/14
[58] Field of Search .... 340/324 R, 324 M, 324 AD, 340/168 S, 166 EL, 336

[56] References Cited
UNITED STATES PATENTS
3,179,883  4/1965  Farrow...................... 340/324 AD

*Primary Examiner*—Marshall M. Curtis
*Attorney, Agent, or Firm*—Craig & Antonelli

[57] ABSTRACT

A digital circuit has a memory circuit and a logical circuit connected in cascade between first and second delay circuits. The first delay circuit controls an input signal to the digital circuit, so that the delay of the input signal due to a stage or stages preceding to the digital circuit may fall within a delay by the first delay circuit, and the second delay circuit controls an output signal from the digital circuit, so that delays due to the memory and logical circuits may fall within a delay by the second delay circuit, whereby the output signal is made apparently free from the delays due to the preceding stage or stages and to the memory and logical circuits.

4 Claims, 10 Drawing Figures

DIGITAL CIRCUIT TO ELIMINATE DISPLAY FLICKER

This is a division of application Ser. No. 332,522, filed Feb. 14, 1973.

BACKGROUND OF THE INVENTION

1. Field of the Invention

The present invention relates to digital circuits, and more particularly to a digital circuit which includes a delay circuit, such as a flip-flop circuit, and a logical circuit.

2. Description of the Prior Art

Digital circuits each including a delay circuit and a logical circuit have hitherto been known. An example of the digital circuits having been generally employed is shown in FIG. 1a.

In the figure, $L_1$ designates a logical circuit, to which an input signal $I_1$ is fed from a circuit, for example, a logical circuit at the preceding stage. $D_1$ indicates a delay circuit, which is, by way of example, a dynamic flip-flop circuit of 1 bit composed of field-effect transistors. The flip-flop circuit comprises field-effect transistors $Tt_1$ and $Tt_2$ for transfer gates which are delay means, field-effect transistors $Tl_1$ and $Tl_2$ which function as load resistances, and field-effect transistors $Td_1$ and $Td_2$ which serve to temporarily store information. The transistors $Td_1$ and $Tl_1$, and those $Td_2$ and $Tl_2$ constitute inverter circuits, respectively. The gate electrodes of the transistors $Tt_1$ and $Tt_2$ have clock pulses $\phi_1$ and $\phi_2$ applied thereto, respectively, the clock pulses differing in phase from each other as shown in FIG. 1c.

Herein, if a delay of the input signal $I_1$ and a delay of the logical circuit $L_1$ do not occur, there is no problem. In contrast, a problem occurs where the phase difference Tpl between the clock pulses $\phi_1$ and $\phi_2$ is exceeded as shown in FIG. 1c by the sum (Tdi + Tdl) between the delay Tdi of the input signal $I_1$ with respect to the clock pulse $\phi_2$, the delay resulting from the input signal being fed to the logical circuit $L_1$ via another logical circuit, a buffer circuit or the like, being connected at the stage previous to the logical circuit $L_1$, and the delay Tdl of the signal as is caused in the logical circuit $L_1$.

More specifically, the output signal Va of the logical circuit $L_1$ should originally be written in the storage transistor $Td_1$ by the transistor $Tt_1$ at the time of a trigger portion X of the clock pulse train $\phi_1$. Nevertheless, it is written at the time of the next trigger portion Y because of the delay (Tdi + Tdl) discussed above. As a result, while the delay Tda of an output signal $O_1a$ with respect to the clock pulse $\phi_2$ should be one period T (1 bit) of the clock pulse train $\phi_2$, it becomes a delay corresponding to 2 bits as is illustrated in FIG. 1c.

On the other hand, the connection relation between the logical circuit $L_1$ and the delay circuit $D_1$ may be reversed in order to make the delay Tdi of the input signal $I_1$ negligible. In this case, however, it is inevitable that the delay Tdl of the logical circuit $L_1$ is added to the output signal.

SUMMARY OF THE INVENTION

It is, accordingly, the principal object of the present invention to provide a digital circuit in which a delay circuit is so arranged that the delay of a signal in a logical circuit can be neglected.

Another object of the present invention is to provide a digital circuit which can be constructed of a small number of circuit elements.

Still another object of the present invention is to provide a digital circuit by which the delay of a display signal in a decoder can be neglected in a digital display circuit, and yet, the number of circuit elements for the measure need not be very large.

In accordance with an embodiment of the present invention, there is provided a digital circuit which comprises first delay means to control the writing operation by a first phase of a pulse signal, second delay means to control the reading operation by a second phase of a pulse signal differing in phase from the first phase of the pulse signal, and memory means and a logical circuit successively connected between the first and second delay means. The memory means is provided with at least one stage of an inverter circuit in order to store a signal delayed by the first delay means.

With such a construction, the delay of an input signal fed to the first delay means is included in the delay by the first delay means, while delays by the memory means and the logical circuit are included in a delay by the second delay means.

Consequently, only the delays by the first and second delay means appear in an output signal which is derived from the second delay means. The foregoing apparent delays of the input signal and by the memory means and the logical circuit are eliminated.

In accordance with another embodiment of the present invention, there is provided a digital circuit which comprises a logical circuit having at least two input terminals, first and second delay means to control the writing operation by a first phase of a pulse signal, and third delay means to control the reading-in operation by a second phase of a pulse signal differing in phase from the first phase of a pulse signal, so that input signals are applied to the two input terminals of the logical circuit through the first and second delay means, respectively, and that an output signal is derived from the output side of the logical circuit through the third delay means.

With such construction, the delays of the input signals applied to the logical circuit through the first and second delay means and the delay of a signal in the logical circuit are apparently eliminated and, therewith, the reduction of the number of circuit elements employed can be achieved.

The invention itself and the other objects and aspects of the invention will become apparent from the following description taken in conjunction with the accompanying drawings.

BRIEF DESCRIPTION OF THE DRAWINGS

FIG. 2a shows an example of the arrangement of a delay circuit and a logical circuit, while FIG. 2b shows another embodiment of the present invention which effects the same logical function as that of the arrangement in FIG. 2a;

FIG. 3a shows another example of the arrangement of a delay circuit and a logical circuit, while FIG. 3b shows another embodiment of the present invention which achieves the same logical function as that of the arrangement in FIG. 3a; FIG. 4c illustrates yet another embodiment of the present invention as is a concrete form of parts of the block diagram in FIG. 4a.

PREFERRED EMBODIMENTS OF THE INVENTION

Figure 1A:
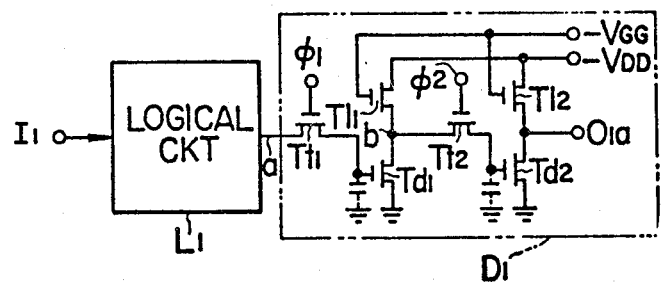
FIG. 1a shows a prior-art digital circuit which includes the delay circuit and the logical circuit, the figure having been already referred to, FIG. 1b shows the arrangement of a delay circuit and a logical circuit according to the present invention.
Figure 1B:
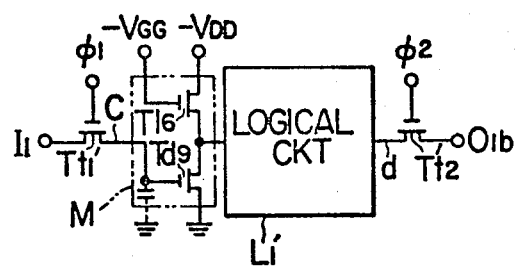
FIG. 1c is a time chart for explaining the operation of the digital circuit including the delay circuit and the logical circuit according to the present invention and that of the prior-art circuit by making a comparison therebetween, the figure having been partially referred to in the previous description.

FIG. 1b shows the arrangement of a delay circuit and a logical circuit according to the present invention. Referring to the figure, M designates a memory circuit, $L_1'$ a logical circuit. $Tt_1'$ and $Tt_2'$ indicate transfer gate transistors for delay means, which are respectively located on the input side and output side of the logical circuit $L_1'$.

As the memory circuit M, a circuit comprising at least one inverter circuit is used. The embodiment employs an inverter circuit which includes a transistor $Tl_6$ functioning as a load resistance and a transistor $Td_9$ for storage. The inverter circuit so termed in the present invention, however, is not restricted thereto. It also represents, for example, a signal-inverting function portion in a circuit in which another transistor is connected in parallel with the transistor $Td_9$, or in a logical circuit in which another transistor is connected in series with the transistor $Td_9$.

Let it now be supposed that the transistors are field-effect transistors of P-channel type, while positive logic is adopted as the logical system. Then, the former of the exemplified circuits becomes a NAND circuit. In this case, both the transistor $Td_9$ and the other transistor connected in parallel therewith constitute inverter circuits, since each has the function of inverting the output signal between the drain and source with respect to the input signal between the gate and source. It is, accordingly, deemed that the OR logic between the inverted signals of the input signal is employed. On the other hand, the latter becomes a NOR circuit. In this case, both the transistor $Td_9$ and the other transistor connected in series therewith constitute inverter circuits as in the above case. It can, accordingly, be deemed in this case that the AND logic between the inverted signals of the gate input signal is employed.

Although the logical circuit $L_1'$ is connected at the stage subsequent to the memory circuit M, the memory circuit M may also be used as a part of the logical circuit $L_1'$. In this case, the logical circuit $L_1'$ consists of at least an inverter circuit for storage and a logical circuit for effecting the logic between an input signal thereof and another signal. Where the portion of the logical circuit $L_1'$ can also be employed as the memory means in this manner, the number of circuit elements to be used can be reduced in comparison with that in the prior-art circuit in FIG. 1a. In addition, the delay is thereby reduced.

Figure 1C:
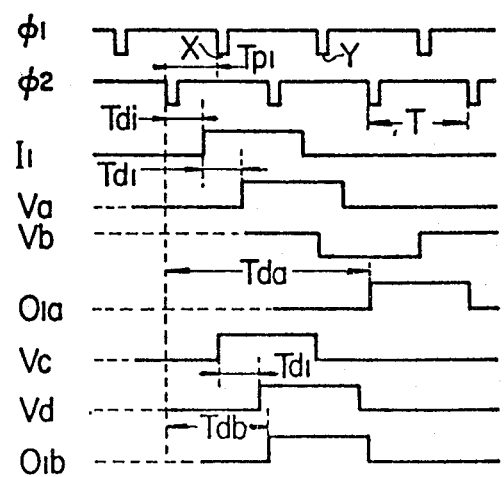

The operation of the circuit thus constructed will now be described with reference to the time chart in FIG. 1c. In the figure, Vc indicates an electric potential at a point c, namely, an electric potential of charges accumulated in the gate electrode of the storage transistor $Td_9$. Vd designates the electric potential at a point d, namely, the output potential of the logical circuit $L_1'$. $O_1b$ represents an output signal. It is assumed that the relation between the input signal $I_1$ and the clock pulse trains $\phi_1$ and $\phi_2$ is under the same condition as in FIG. 1a.

The input signal $I_1$ with a phase lag of Tdi relative to the phase of the clock pulse $\phi_2$ is written into the memory circuit M in such a way that the transfer gate transistor $Tt_1'$ is rendered conductive when the clock pulse train $\phi_1$ is at the trigger portion X. The information Vc to be accumulated in the storage transistor $Td_9$ at this time is synchronized with the clock pulse train $\phi_1$, the lag of the information in phase relative to the clock pulse $\phi_2$ corresponds to the phase difference Tpl between the clock pulses $\phi_1$ and $\phi_2$, and the delay Tdi of the input signal $I_1$ is independent of Vc. In other words, the delay Tdi of the input signal $I_1$ is contained in the phase difference Tpl between the clock pulses $\phi_1$ and $\phi_2$, and it apparently disappears.

Next, the output signal of the memory circuit M is fed to the logical circuit $L_1'$, and a predetermined logic function is effected therein. At this time, the output signal Vd of the logical circuit $L_1'$ causes the delay Tdl with respect to the information Vc, namely, to the clock pulse $\phi_1$.

The output signal Vd of the logical circuit $L_1'$ is taken out as the output signal $O_1b$ from the transistor $Tt_2'$ when the transfer gate transistor $Tt_2'$ is subsequently rendered conductive by the clock pulse $\phi_2$.

The delay of the output signal $O_1b$ relative to the information Vc at this time becomes equal to a phase difference (T − Tpl), the delay Tdl of the signal in the logical circuit $L_1'$ is contained in the phase difference (T − Tpl), and the delay apparently vanishes. Accordingly, the delay Tdb of the output signal $O_1b$ relative to the clock pulse $\phi_2$ becomes equal to the intrinsic delay, that is, the delay T (1 bit) of the signals in the transistors $Tt_1'$ and $Tt_2'$ being the delay means. The delay of the input signal $I_1$ and the delay of the signal in the logical circuit are contained within the delay T.

As described above, according to the present invention, the two delay means $Tt_1'$ and $Tt_2'$ arranged upstream and downstream of the logical circuit $L_1'$ in a divided manner take partial charges in absorbing the delay Tdi of the input signal $I_1$ and the delay Tdl of the signal in the logical circuit $L_1'$, respectively. The delays in their apparent forms are therefore lost, so that the aforementioned problem is solved. In this manner, in accordance with the present invention, the allowance in design for the delay of the input signal and that of the signal in the logical circuit can be set at a large value, or the degree of safety can be made high.

Figure 2A:
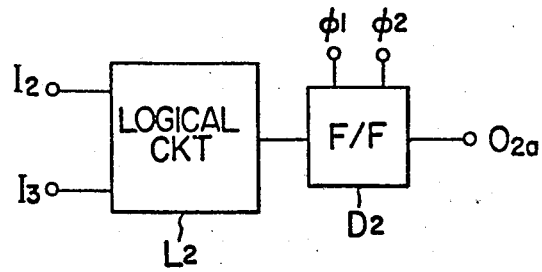
Figure 2B:
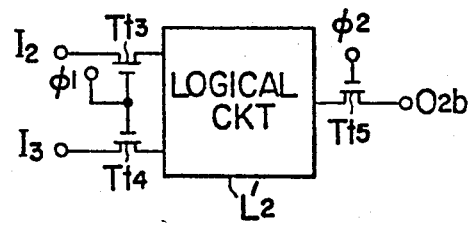

FIG. 2b shows another embodiment of the present invention, and depicts a circuit which achieves the same logical function as the circuit in FIG. 2a.

Referring to FIG. 2a, a logical circuit $L_2$ has two input signals $I_2$ and $I_3$ applied thereto. The output signal of the logical circuit is delayed by a delay circuit $D_2$ composed of a flip-flop circuit, and is taken out as an output signal $O_2a$. As the delay circuit $D_2$, there is employed, for example, the dynamic flip-flop circuit $D_1$ as shown in FIG. 1a.

The arrangement of a delay circuit and the logical circuit according to the present invention and as illustrated in FIG. 2b can eliminate the apparent delays similarly to the embodiment shown in FIG. 1b. Moreover, it can decrease the number of circuit elements to be employed.

In FIG. 2b, $Tt_3$, $Tt_4$ and $Tt_5$ designate transfer gate transistors for delay means, while $L_2'$ indicates a logical circuit. In order to establish the same logical function as in FIG. 2a, both the two input signals $I_2$ and $I_3$ are fed through the delay means to the logical circuit $L_2'$. The input signal $I_2$ is supplied through the transistor $Tt_3$ into the logical circuit $L_2'$, while the input signal $I_3$ is delivered through the transistor $Tt_4$ thereinto. The gate electrodes of both the transistors $Tt_3$ and $Tt_4$ have clock pulses $\phi_1$ impressed thereon. The output signal of the logical circuit $L_2'$ is delayed by the transistor $Tt_5$ for the transfer gate, and is taken out as an output signal $O_2b$.

With such a circuit arrangement, as in the embodiment in FIG. 1b, the delays of the input signals $I_2$ and $I_3$ are respectively contained in the delay times of the signals in the delay means $Tt_3$ and $Tt_4$, and the delay of a signal in the logical circuit $L_2'$ is contained in the delay time of the signal in the delay means $Tt_5$. Thus, the delays of only the delay means appear in the output signal $O_2b$, and the delays of the input signals $I_2$ and $I_3$ and the delay of the signal in the logical circuit $L_2'$ are apparently removed.

If a part or the whole of the logical circuit $L_2'$ is utilized as a memory circuit required at the stage succeeding the delay means $Tt_3$ and $Tt_4$, the number of circuit elements to be used can be made small.

Figure 3A:
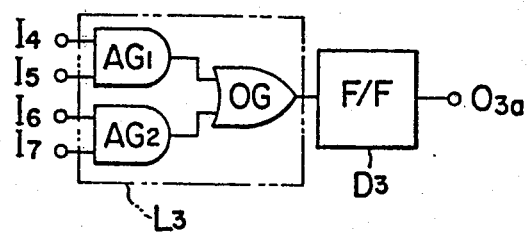
Figure 3B:
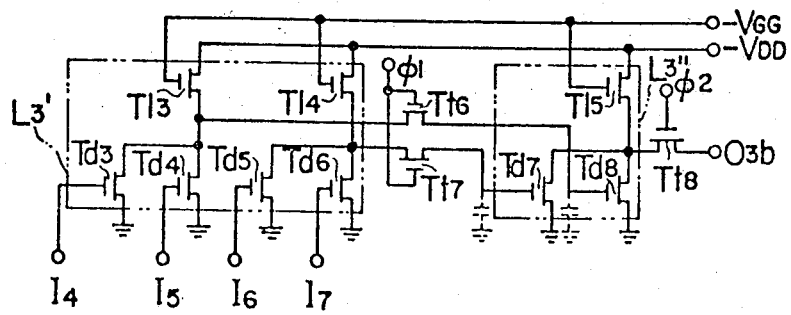

FIG. 3b shows a further embodiment according to the present invention, which effects the same logical function as that of a circuit illustrated in FIG. 3a.

Referring to FIG. 3a, $L_3$ designates a logical circuit, and $D_3$ a delay circuit. The logical circuit $L_3$ consists of two-input AND circuits $AG_1$ and $AG_2$, and a two-input OR circuit OG receiving the output signals of the respective AND circuits as its inputs. Each of the logical gate circuits of the AND circuits $AG_1$ and $AG_2$ and the OR circuit OG can be considered as a NAND circuit in place thereof.

Referring to FIG. 3b, $Tl_3 - Tl_5$ designate transistors for loads, and $Tt_6 - Tt_8$ transistors for transfer gates as serve as delay means. Transistors $Td_3$, $Td_4$ and $Tl_3$, those $Td_5$, $Td_6$ and $Tl_4$ and those $Td_7$, $Td_8$ and $Tl_5$ constitute the two-input NAND circuits, respectively, and correspond to the AND circuit $AG_1$, AND circuit $AG_2$ and OR circuit OG, respectively.

In the embodiment according to the present invention in FIG. 3b, the logical circuit $L_3$ in FIG. 3a is divided into a logical circuit $L_3'$ consisting of the two 2-input NAND gates and a logical circuit $L_3''$ consisting of the one 2-input NAND gate. The delay means $Tt_8$ is connected on the output side of the latter logical circuit, while the delay means $Tt_6$ and $Tt_7$ are connected between both the logical circuits.

With such a construction, the delays of input signals $I_4 - I_7$ and the delays of signals in the logical circuit $L_3'$ can be obviated by the delay means $Tt_6$ and $Tt_7$. On the other hand, the delays of signals in the logical circuit $L_3''$ can be obviated by the delay means $Tt_8$.

Accordingly, the allowance for the delays of the input signals $I_4 - I_7$ or for the delays of the signals in the respective NAND gate circuits becomes large as compared with that in the circuits in FIG. 3a. This affects the relation between the switching speed of circuit elements in, for example, an integrated semiconductor circuit and the occupying area of the circuit elements, and leads to the reduction of the occupying area of the circuit elements in this case. More specifically, where the allowance for the delays is small, the impedances of the transistors $Tl_3 - Tl_5$ for loads are restricted to be lower than a certain determined value in relation to load capacities, and the area occupied by the transistors becomes large. In attendance therewith, the area occupied by the transistors $Td_3 - Td_8$ becomes still larger from the relation with a voltage division ratio which is determined by the transistors $Td_3 - Td_8$ and the load transistors $Tl_3 - Tl_5$.

The transistors $Td_7$ and $Td_8$ in the logical circuit $L_3''$ not only constitute a NAND circuit, but also effect the function of temporarily storing the signals, having been delayed by the transistors $Tt_6$ and $Tt_7$, by the gate capacitances of the transistors $Td_7$ and $Td_8$. The transistors $Tl_1$ and $Td_1$ in the delay circuit $D_1$ as shown in FIG. 1a can, therefore, be dispensed with. Further, if an output signal $O_3b$ delayed by the transistor $Tt_8$ is fed to a circuit with memory means at the succeeding stage, then the transistors $Tl_2$ and $Td_2$ can also be similarly dispensed with. The delay circuit $D_1$ in FIG. 1a employs six transistors, whereas the delay means in FIG. 3b include three transistors. When a comparison is made of the area between them, the embodiment corresponds to approximately 70% of the delay circuit $D_1$.

It is needless to say that where the number of inputs of the OR circuit OG is three or more, the delay means may be similarly increased.

Figures 4A, 4B:
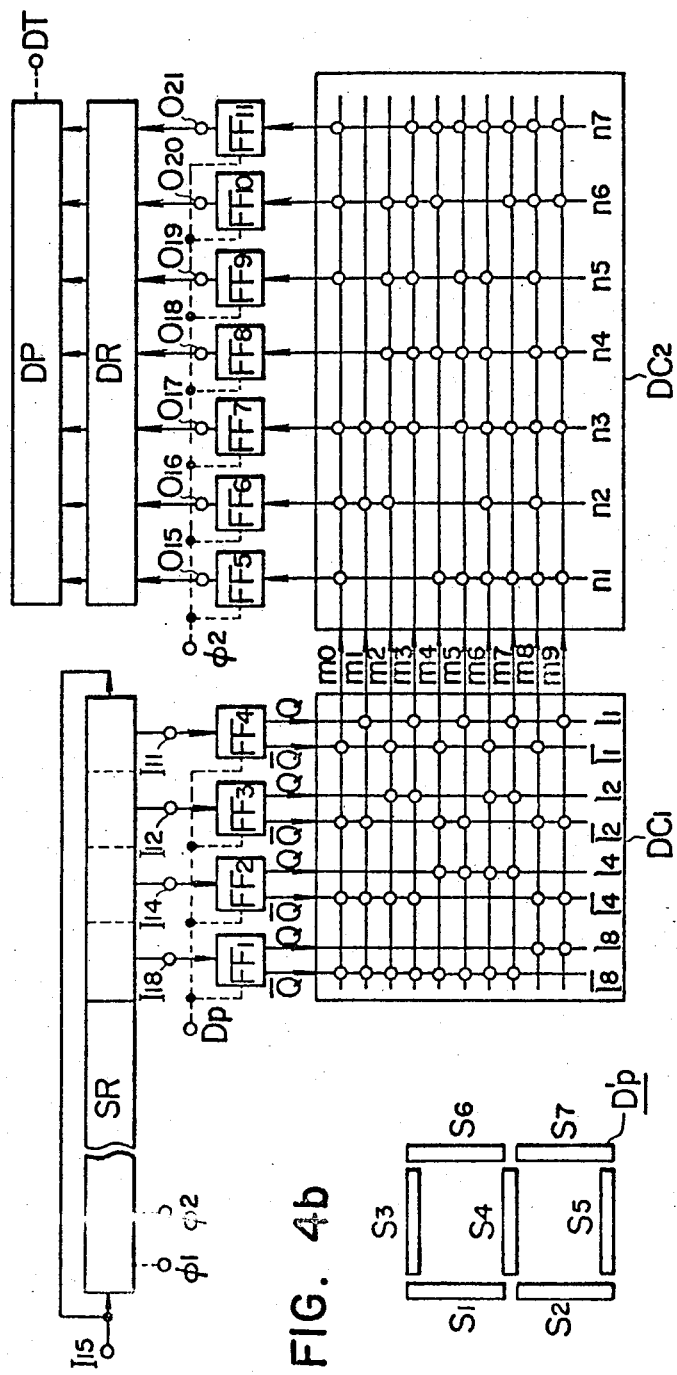
FIG. 4a is a block diagram showing still another embodiment in the case where the present invention is applied to a display circuit.
FIG. 4b illustrates an example of a display device for use in the display circuit.

FIG. 4a shows a yet further embodiment in the case where the present invention is applied to a display circuit.

Referring to the figure, SR designates a shift register, which is constructed, for example, in such a manner that a plurality of stages of the dynamic flip-flop circuits $D_1$ shown in FIG. 1a are connected in cascade. Binary-coded signals are successively shifted through the respective flip-flop circuits by shift pulses $\phi_1$ and $\phi_2$, and are thereby stored in the shift register. $FF_1 - FF_4$ indicate delay circuits whose writing operations are controlled by digit pulses Dp. The first operand, the second operand, or an operated result is stored in the form of a binary-coded decimal number within the shift register SR. Accordingly, one digit of a decimal number is denoted by four bits. In order to write the binary-coded decimal number every digit, the digit pulse train Dp is synchronized with the clock pulse train $\phi_1$, and is substantially equal in the pulse width to the latter. In addition, the period of the former corresponds to four times of that of the latter $\phi_1$.

$DC_1$ represents a decoder circuit, which is used in order to convert the binary-coded decimal number into the decimal number. The decoder circuit $DC_1$ has eight input lines $1_1$, $1_2$, $1_4$, $1_8$ and $\overline{1_1}, \overline{1_2}, \overline{1_4}, \overline{1_8}$ and ten output lines $m_0 - m_9$. Signals of the first to fourth bits of the binary-coded decimal number are respectively applied to the input lines $1_1$, $1_2$, $1_4$, $1_8$ while their inverted signals are applied to the input lines $\overline{1_1}, \overline{1_2}, \overline{1_4}, \overline{1_8}$.

$DC_2$ indicates another decoder circuit, which converts the decimal signals into segment signals for lighting predetermined segments of a display device Dp' which has seven segments $S_1 - S_7$ illustrated in FIG. 4b. Each of the segments $S_1 - S_7$ is made up of, for example, a luminescent diode. The segments are arranged such that, for displaying the decimal number "8," all the segments are lit, and that, for indicating the decimal number "3," the segments $S_3$, $S_6$, $S_4$, $S_7$ and $S_5$ are lit. Accordingly, the decoder circuit $DC_2$ possesses ten input lines $m_0$-$m_9$ corresponding to the decimal number, and seven output lines $n_1$-$n_7$ corresponding to the respective segment signals. Where a device having ten independent digit display portions, such as Nixie tubes, is employed as the display device, the decoder $DC_2$ at the output stage is unnecessary.

In the illustrated embodiment, the decoder circuits $DC_1$ and $DC_2$ consist of ROM's (read only memories) which are composed of field-effect transistors. Each part in the figure as is indicated by a mark o represents that the transistor is comprised between the input line and output line which intersect thereat.

$FF_5$-$FF_{11}$ denote delay circuits whose reading-in operations are controlled by the clock pulses $\phi_2$.

Shown at DR is a driver circuit which is used in order that the segment signals $O_{15} - O_{21}$ having been delayed by the delay circuits $FF_5$-$FF_{11}$ may be converted into signals capable of driving a display unit DP.

The display unit DP is equipped with a plurality of the display devices Dp' shown in FIG. 4b, by the number of digits as required. The display unit DP is operated such that the display devices at the respective digits are lit sequentially, namely, in a time-sharing sequence by digit switching signals DT. Thus, the so-called dynamic display system is adopted in the embodiment. Utilized as the digit-switching signals DT are a plurality of pulse signals which are synchronized with the clock pulses $\phi_2$, which have a pulse width being four times as large as that of the clock pulses $\phi_2$ and which have respectively different phases.

In the case of the dynamic display system, unless the segment signals $O_{15} - O_{21}$ are synchronized with the digit-switching signals DT, namely, with the clock pulses $\phi_2$, flickering appears in the display unit DP. In a prior-art dynamic display circuit, the flip-flop circuits whose writing and reading operations are controlled by the digit pulses Dp and the clock pulses $\phi_2$ are located between the shift register and the decoder circuit, and the output side of the decoder circuit is directly connected with the driver circuit. Therefore, the delay of the signals in the decoder circuit has been a problem. It becomes the cause of the flickering of the display unit as stated above.

According to the present invention, the delay means $FF_1$-$FF_4$ whose writing times are controlled by the digit pulses Dp are located at the stage preceding the decoder circuits $DC_1$ and $DC_2$, while the delay means $FF_5$-$FF_{11}$ whose reading operations are controlled by the clock pulses $\phi_2$ are located at the stage succeeding the decoder circuits $DC_1$ and $DC_2$. Therefore, the delays of the signals in the decoder circuits $DC_1$ and $DC_2$ disappear apparently. As a result, the segment signals $O_{15} - O_{21}$ are synchronized with the clock pulses $\phi_2$, that is, they are synchronized with the digit-switching signals DT. Thus, the flickering of the display unit can be prevented.

There is also another method for obviating the delays of the decoder circuits $DC_1$ and $DC_2$, which consists in that the flip-flop circuits whose writing and reading are controlled by the digit pulses Dp and the clock pulses $\phi_2$ are connected at the stage succeeding to the decoder circuits $DC_1$ and $DC_2$. In this case, however, it is necessary to increase the number of circuit elements, because the number of the input terminals of the decoder circuits $DC_1$ and $DC_2$ is 4 (four), whereas the number of the output terminals is 7 (seven), so that the latter is larger than the former. Where a Nixie tube or the like is employed in the display unit, the ratio between the numbers of the input and output terminals of the decoder circuit is 4 to 10, and the difference is still larger.

Figure 4C:
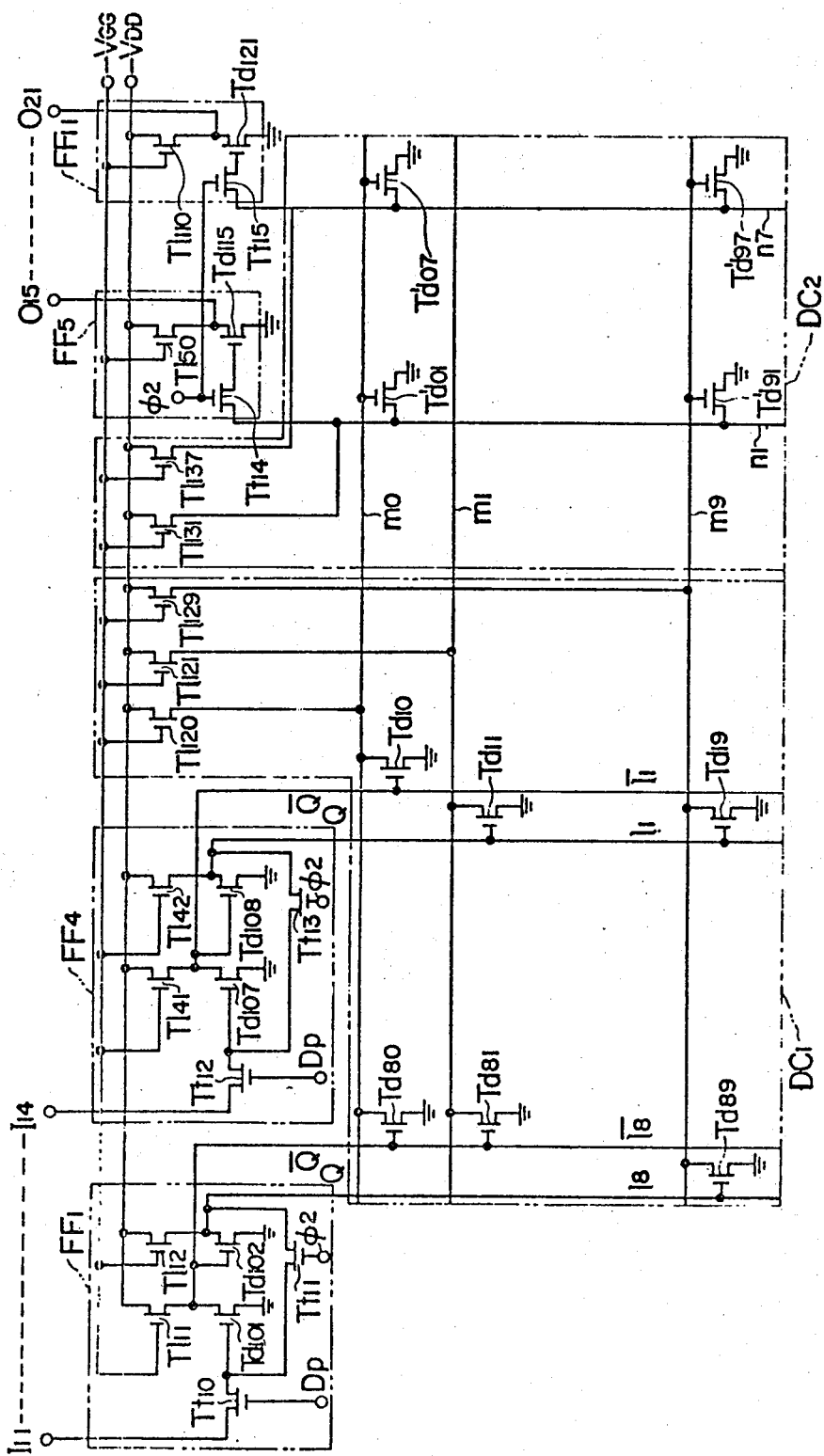

A concrete construction of the delay means $FF_1$ to $FF_{11}$ and the decoder circuits $DC_1$ and $DC_2$ will now be described of a case where field-effect transistors are used, reference being had to the circuit diagram in FIG. 4c. In the figure, the same parts as in FIG. 4a are designated by the same symbols.

The delay means $FF_1$ is composed of a transistor $Tt_{10}$ for a transfer gate, transistors $Tl_{11}$ and $Td_{101}$ and transistors $Tl_{12}$ and $Td_{102}$ constituting two stages of inverter circuits, and a transistor $Tt_{11}$ for a transfer gate serves to feed back the output signal of the latter stage of inverter circuit to the input side of the former stage of inverter circuit. The delay means $FF_1$ holds information statically. The other delay means $FF_2$-$FF_4$ are similarly constructed. If the transistor $Td_{101}$ for storage and a transistor $Td_{89}$ connected to the input line 8 of the decoder circuit $DC_1$ can store information for sufficient time intervals relative to the period of the digit pulses Dp, then dynamic ones can be used as the delay means. In this case, the construction may be made such that the transistors $Tl_{12}$ and $Td_{102}$ constituting a subsequent stage of an inverter circuit and the transfer gate transistor $Tt_{11}$ are omitted and that the input line $l_8$ of the decoder circuit $DC_1$ is connected to the gate electrode of the transistor $Td_{101}$.

The delay circuit $FF_5$ is composed of a transistor $T_{14}$ for a transfer gate, and transistors $Tl_{50}$ and $Td_{115}$ constituting an inverter circuit. The other delay means $FF_6$-$FF_{11}$ have similar constructions. The output signals $O_{15} - O_{21}$ of the decoder circuit $DC_2$ are fed to the driver circuit DR at the following stage, and where the driver circuit DR has memory means, the transistors $Tl_{50}$-$Tl_{110}$ and $Td_{115}$-$Td_{121}$ can be omitted. It is also possible to bring the delay means $FF_5$-$FF_{11}$ into the static form as the delay means $FF_1$-$FF_4$, and to oppositely bring the delay means $FF_1$-$FF_4$ into the dynamic form. From the viewpoint of the number of circuit elements to be employed, however, it is more preferable that, as in the illustrated embodiment, the static delay means larger in the number of the circuit elements are located on the input side of the smaller number of terminals, while the dynamic delay means smaller in the number of the circuit elements are disposed on the output side of the larger number of terminals.

With such a construction, notwithstanding that the ROM's of comparatively low switching speeds are used as the decoder circuits $DC_1$ and $DC_2$, their delays are contained in the delays of the delay means $FF_5$-$FF_{11}$, and no apparent delay arises. Simultaneously therewith, the construction is advantageous in the number of circuit elements to be used.

Although the present invention has thus far been described in conjunction with some preferred embodiments, it is not restricted thereto, but allows for a variety of modifications.

For example, the delay means may be constructed such that two series transistors are employed, one of which is applied with an input signal and the other of which is applied with a clock pulse, and that when the writing or reading operation of the input signal is to be started, the transistor to which the clock signal is applied is rendered conductive. Similarly, when using two transistors connected in parallel, when the writing or reading operation is to be initiated, the transistor on which the clock signal is impressed may be brought into the non-conductive state. In this case, although the construction is disadvantageous with respect to the number of circuit elements in comparison with that employing the transfer gate field-effect transistor as the delay means, it can advantageously use clock signals of a low voltage level.

A flip-flop circuit utilizing an inverter circuit composed of, not the insulated gate field-effect transistors, but bipolar transistors, can also be employed as the memory means. In this case, the occupying area increases. The construction of the delay means with the bipolar transistors, however, is more desirable in the manufacture of an integrated semiconductor circuit, and is more easily handled from the viewpoint of signal levels. Furthermore, it is needless to say that the present invention is applicable not only to the case of driving the load transistors with a DC power source, but also to the case of the clock drive thereof.

We claim:
1. A circuit comprising:
 a plurality of input terminals to which respective information signals are applied;
 a logical circuit, coupled to receive said information signals and to effect a prescribed logical operation thereon;
 an output circuit, coupled to said logical circuit, for providing an indication of the operation of said logical circuit on said information signals, including a display device for luminously displaying the result of the operation of said logical circuit on said information signals;
 a plurality of first delay means, respectively connected between said plurality of input terminals and said logical circuit, for controlling the application of said information signals to said logical circuit in accordance with a first pulse signal;
 a multiplicity of second delay means, respectively connected between said logical circuit and said output circuit, for receiving the result of the operation of said logical circuit and applying said result to said output circuit in accordance with a second pulse signal having a phase difference relative to said first pulse signal; and
 an input shift register for supplying information signals at the outputs of respective stages thereof and for shifting the contents thereof in synchronism with said first and second pulse signals.

2. A display circuit according to claim 1, wherein said logical circuit comprises a first MOSFET matrix for decoding said information signals into decimal signals and a second MOSFET matrix connected to said first matrix for decoding said decimal signals into display signals.

3. A display circuit according to claim 2, wherein each of said first delay means comprises a flip-flop circuit.

4. A display circuit according to claim 3, wherein each of said second delay means comprises a flip-flop circuit.

* * * * *